(12) United States Patent
Murphy et al.

(10) Patent No.: US 7,670,877 B2
(45) Date of Patent: Mar. 2, 2010

(54) RELIABILITY ENHANCEMENT PROCESS

(75) Inventors: William E. Murphy, Vestal, NY (US);
Ryan S. Riegle, Endicott, NY (US);
Richard W. Shields, Endwell, NY (US);
David L. Vos, Apalachin, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 11/873,146

(22) Filed: Oct. 16, 2007

(65) Prior Publication Data

US 2008/0032455 A1      Feb. 7, 2008

Related U.S. Application Data

(62) Division of application No. 11/032,526, filed on Jan. 10, 2005.

(51) Int. Cl.
*H01L 21/00* (2006.01)
(52) U.S. Cl. .................. 438/113; 438/123; 438/124
(58) Field of Classification Search .................. 438/113, 438/123, 124
See application file for complete search history.

(56) References Cited

U.S. PATENT DOCUMENTS

| | | | |
|---|---|---|---|
| 5,834,337 A | 11/1998 | Unger et al. | |
| 5,900,675 A | 5/1999 | Appelt et al. | |
| 5,917,700 A | 6/1999 | Clemens et al. | |
| 6,084,297 A * | 7/2000 | Brooks et al. | 257/698 |
| 6,104,090 A | 8/2000 | Unger et al. | |
| 6,236,568 B1 | 5/2001 | Lai et al. | |
| 6,297,559 B1 | 10/2001 | Call et al. | |
| 6,323,066 B2 | 11/2001 | Lai et al. | |
| 6,326,244 B1 * | 12/2001 | Brooks et al. | 438/124 |
| 6,438,045 B1 | 8/2002 | King et al. | |
| 6,441,499 B1 | 8/2002 | Nagarajan et al. | |
| 6,448,110 B1 | 9/2002 | Chen et al. | |
| 6,462,405 B1 | 10/2002 | Lai et al. | |
| 6,507,116 B1 | 1/2003 | Caletka et al. | |
| 6,512,176 B2 | 1/2003 | Yaguchi et al. | |
| 6,548,175 B2 | 4/2003 | Sachdev et al. | |
| 6,560,108 B2 | 5/2003 | Lo et al. | |
| 6,566,166 B2 | 5/2003 | Chien | |
| 6,586,829 B1 | 7/2003 | Yaniv et al. | |
| 6,670,222 B1 | 12/2003 | Brodsky | |
| 6,740,971 B2 * | 5/2004 | Brooks et al. | 257/738 |
| 6,757,968 B2 | 7/2004 | Lo et al. | |
| 6,818,972 B2 | 11/2004 | Jimarez et al. | |
| 6,876,553 B2 | 4/2005 | Zhao et al. | |

(Continued)

FOREIGN PATENT DOCUMENTS

EP      1067601      1/2001

(Continued)

*Primary Examiner*—Laura M Menz
(74) *Attorney, Agent, or Firm*—Michael Best & Friedrich LLP

(57) ABSTRACT

A method of packaging a semiconductor component with a printed wiring board is disclosed. The method includes determining a first distance, applying a thin film onto a surface of the semiconductor component such that the thin film is spaced apart from a support of the semiconductor, applying a solder pad onto the printed wiring board, placing the semiconductor component with the thin film onto the printed wiring board, and positioning the thin film adjacent the solder pad.

21 Claims, 2 Drawing Sheets

U.S. PATENT DOCUMENTS

| | | | |
|---|---|---|---|
| 6,982,486 B2 * | 1/2006 | Brooks et al. | 257/738 |
| 7,038,311 B2 * | 5/2006 | Woodall et al. | 257/706 |
| 7,268,013 B2 * | 9/2007 | Brooks et al. | 438/106 |
| 2002/0140077 A1 | 10/2002 | King et al. | |
| 2004/0026781 A1 | 2/2004 | Nakai et al. | |
| 2004/0080055 A1 | 4/2004 | Jiang | |
| 2006/0151581 A1 * | 7/2006 | Murphy et al. | 228/245 |
| 2008/0032455 A1 * | 2/2008 | Murphy et al. | 438/123 |

FOREIGN PATENT DOCUMENTS

| | | |
|---|---|---|
| JP | 10126047 | 5/1998 |
| JP | 2003234434 | 8/2003 |

* cited by examiner

RELIABILITY ENHANCEMENT PROCESS

RELATED APPLICATION

This is a Divisional of U.S. patent application Ser. No. 11/032,526 filed Jan. 10, 2005, which is incorporated herein by reference.

BACKGROUND OF THE INVENTION

The invention relates to reliability enhancement processes, and more particularly, to a reliability enhancement process for packages having an integrated circuit ("IC") mounted on a printed wiring board ("PWB").

Moderate to high power original-equipment-manufacturer ("OEM") perimeter pattern IC's such as perimeter pattern ball grid array ("BGA") and thin small-outline packages ("TSOP") generate a large amount of heat during operation. Typically these OEM IC's are mounted on a PWB at several solder joints. The large amount of heat typically leads to substantial thermal gradients or differences between the IC's substrate portion and the PWB. As a result, the PWB is also used as a primary heat sink. However, not only do high junction temperatures degrade the reliability of the package, but the differences in the thermal coefficient of expansion also reduce the life of the solder joints. For example, the difference in thermal expansion between the semiconductor component and the PWB is usually at least a factor of 2. That is, for every degree of temperature change, the PWB expands twice as much as the semiconductor component, which then creates mechanical stress.

SUMMARY OF THE INVENTION

In one form, the invention provides a method of packaging a semiconductor component with a printed wiring board. The semiconductor component has a first surface, and a support that extends from the first surface. The support also has a distal end. The method includes determining a first distance between the first surface and the distal end of the support, and applying a thin film onto the first surface of the semiconductor component. The thin film typically has a first thickness that is less than the first distance, and preferably has a plurality of thin film planar dimensions (length and width). The thin film also has a plurality of thermally conductive particles therein. Furthermore, the thin film is spaced apart from the support of the semiconductor.

Thereafter, the method includes applying a solder pad onto the printed wiring board. The solder pad has a solder pad size that matches the thin film's planar dimensions or size. The method then includes placing the semiconductor component with the thin film onto the printed wiring board, and creating a thermal path between the thermally conductive particles of the thin film and the solder pad, that is, from the semiconductor component to the printed wiring board.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted"and variations thereof herein are used broadly and encompass direct and indirect connections, couplings, and mountings. In addition, the terms "connected" and "coupled" and variations thereof are not restricted to physical or mechanical connections or couplings.

Figure 1:
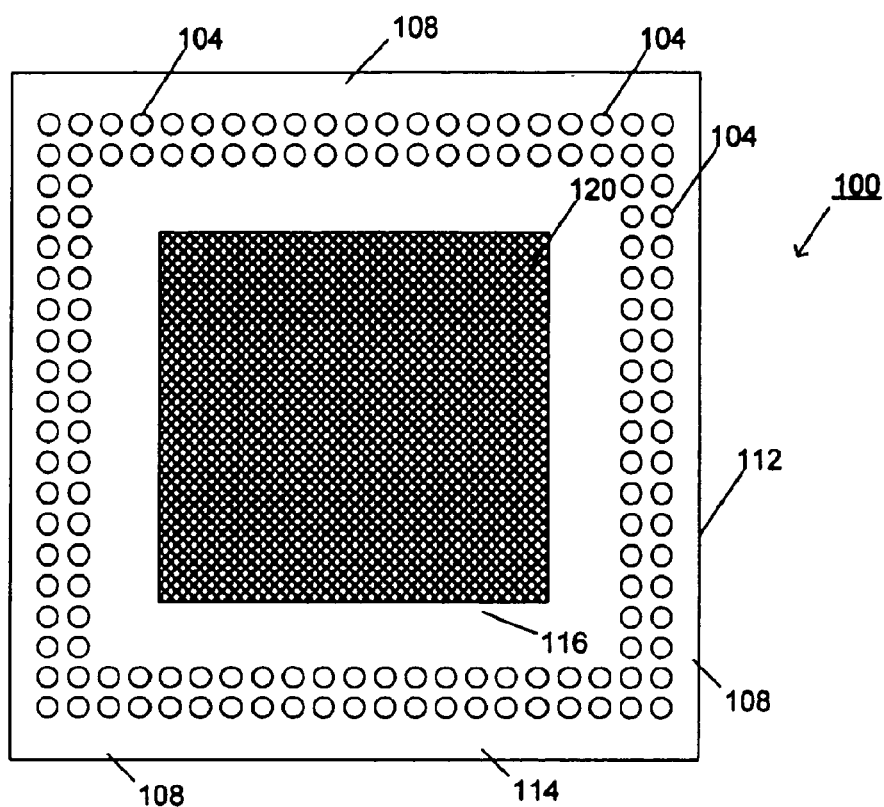
FIG. 1 shows an original equipment manufacturer ("OEM") perimeter pattern ball grid array ("BGA")

FIG. 1 shows an original equipment manufacturer ("OEM") perimeter pattern ball grid array ("BGA") 100. Although FIG. 1 illustrates a BGA, other semiconductor components with outlying supports or contacts or electrical interconnects such as thin small-outline packages ("TSOP") can also be used. The BGA 100 includes a plurality of supports such as solder balls 104 distributed along the perimeter 108 of a substrate 112. The solder balls 104 can include metals such as tin, silver, gold, copper, nickel, tin Bismuth, tin lead, and the like. The solder balls are typically arranged directly on a surface 114 beneath the substrate 112. As a result, any heat generated in the substrate 112 travels straight through the solder balls 104 into any connected components. For example, if the BGA 100 is mounted on a printed wiring board ("PWB"), the heat will be transferred to the PWB. In some embodiments, the BGA 100 can have between 100 and 150 solder balls 104 around the perimeter 108. In such cases, the heat generated travels into the substrate 112, into the center of the substrate 112, then propagates to the perimeter 108 of the substrate 112, and distributes through the solder balls 104 to any attachments. The substrate 112 can include any printed wiring board or materials such as ceramic, alumina, plastic, silicon, metallic elements (such as copper, Kovar®, aluminum silicon composites ("AlSiCp"), and carbon composites), and the like.

Figure 2:
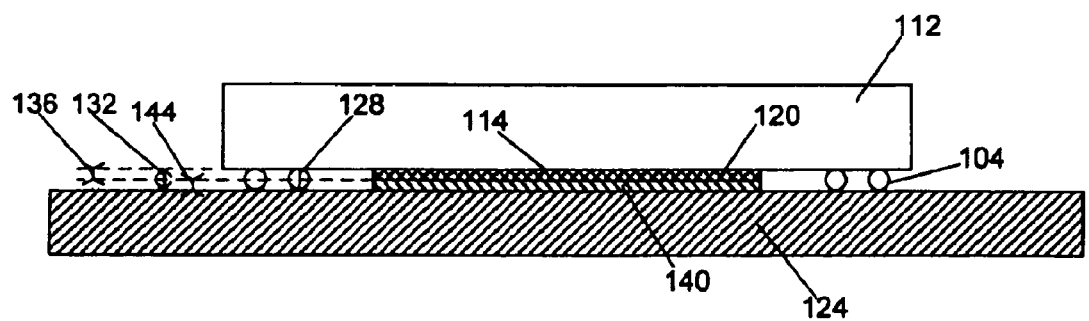
FIG. 2 shows a sectional view of the BGA of FIG. 1 mounted onto a printed wiring board ("PWB")
Figure 3:
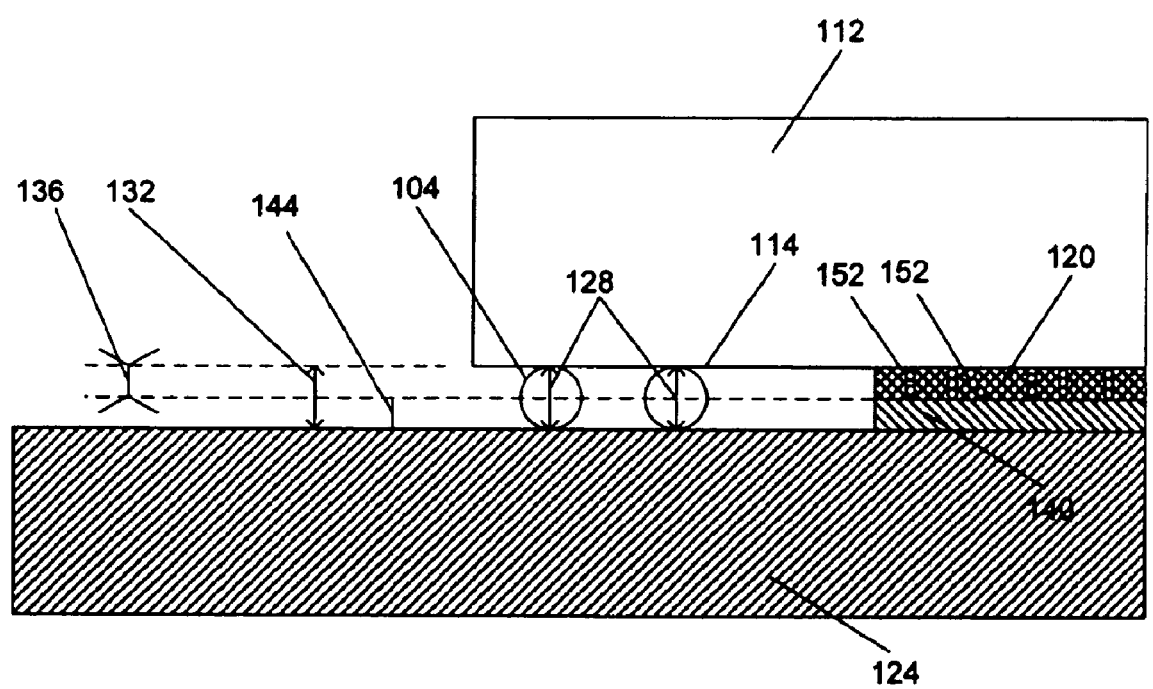
FIG. 3 shows a detailed sectional view of a portion of the BGA of FIG. 2.

A portion 116 of the BGA 100 is generally covered with a thin film 120. The thin film 120 is applied onto the surface 114. As best seen in FIGS. 2 and 3, which show a sectional view of the BGA 100 and a detailed sectional view of a portion the BGA 100 mounted on a PWB 124, respectively, each of the solder balls 104 has a diameter 128. As a result, a gap distance 132 approximately equal to the diameter 128 exists between the surface 114 of the BGA 100 and the PWB 124. The thin film 120 has a thin film thickness 136 that can be less than the distance 132. In addition to the thin film thickness 136, the thin film 120 also a plurality of planar dimensions such as length and width. The thin film 120 can include epoxy, glass, adhesive, and the like. The thin film 120 has also thermally conducting materials, or metallic particles 152 therein, which may include without limitation, gold, nickel, copper, tin, silver, and the like. Furthermore, the thin film 120 can be applied to the portion 116 of the BGA 100 by a variety of thin film deposition techniques. Exemplary techniques include spraying the thin film 120 such as a thin layer of epoxy on the surface 114 of the substrate 112, brushing the thin film 120 or the thin layer of epoxy on the surface 114 of the substrate 112, attaching the thin film 120 or the thin film of epoxy on the surface 114 of the substrate 112, and the like. Furthermore, the thin film 120 is also positioned such that when the thin film 120 is applied, the thin film 120 is spaced apart from the solder balls 104. In some embodiments, the thin film 120 has a random pattern of thermally conductive particles 152. In some other embodiments, the thin film 120 can have some oriented pattern of thermally conductive particles 152 to ensure some thermal bonding or connection between the thermally conductive particles 152 and the solder pad 140.

To dissipate the generated heat, a solder pad 140 is applied to the PWB 124. The solder pad 140 has planar dimensions (length and width) that generally match with the planar dimensions of the thin film 120. The solder pad 140 can have any typical solder metal alloys such as tin lead ("SnPb"), tin bismuth ("SnBi"), and the like. The solder pad 140 can also have a solder mask thereon to facilitate the soldering process, which is discussed hereinafter. FIG. 3 also shows some material of the solder pad 140 aligned as a result from being heated. In some embodiments, some materials of the solder pad 140 are lined up with the thermally conductive particles 152, while other particles may not develop any physical contacts. Furthermore, also shown in FIG. 3, a thermal path can be established by having direct physical contact between the material of the solder pad 140 and thermally conductive particles 152. Other thermal paths can also be established by arranging the solder pad 140 close to the thermally conductive particles 152 such that heat generated by the substrate 112 can still be distributed to the solder pad 140.

Particularly, after the gap distance 132 and the thin film thickness 136 have been determined between the surface 114 of the substrate 112 and the PWD 124, a thickness 144 of the solder pad 140 is also determined. The thickness of the solder pad 140 is generally the difference between the gap distance 132 and the thin film thickness 136. For example, if the gap distance 132 between the substrate 112 and the PWB 124 is 20 mils, and a thin film of epoxy has a thickness of 12 mils with several coated copper particles, the solder pad thickness is generally about 8 mils.

In general, the thin film 120, the solder pad 140 and some metallization (not shown) on the substrate 112 are collectively referred to as a stack. In some embodiments, in addition to thermally expanding in planar directions as discussed, the stack can also expand in the z-direction, which is transverse to the x-y plane of thin film 120. As the stack expands in the z-direction, the semiconductor component like BGA 100 can push away from the PWB 124, and therefore disconnect the solder balls 104 from the substrate 112. As a result, the thickness of the stack including the thin film thickness 136 and the solder pad thickness 144 can also be considered during design. For example, the thin film thickness 136 can be small relative to the solder pad thickness 144 such that when the thin film 120 expands due to thermal conditions, the expansion of thin film thickness 136 can be relatively negligible. In this way, the expansion of the thin film 120 in the z-direction is relatively small even when the coefficient of thermal expansion of the thin film 120 is generally higher than the coefficient of thermal expansion of the solder pad 140. In some embodiments, the thin film thickness 136 is about 2 percent of the stack whereas the solder pad thickness 144 is about 95 percent of the stack. Furthermore, the solder pad 140 can also be chosen such that the coefficient of thermal expansion of the solder pad 140 is comparable to the coefficient of expansion of the solder balls 104. In some other embodiments, the material for solder pad 140 can also be chosen such that the coefficient of thermal expansion of the solder pad 140 is less than the coefficient of thermal expansion of the solder balls 104. In yet some other embodiments, the material for solder pad 140 can be chosen such that the coefficient of thermal expansion of the solder pad 140 matches exactly the coefficient of expansion of the solder balls 104.

After applying the thin film 120 to the surface 114 of the substrate 112, a pick and place machine and process is then used to populating the PWB 124. In this way, the substrate 112 having the thin film 120 can have a corresponding solder pad 140 with a solder mask on the PWB 124. Generally, the PWB 124 include materials such as epoxy glass, FR-4 epoxy, G-10 glass, polymide, multifunctional epoxy on THERMOUNT® reinforcement, Arlon 55NT which is a combination of multifunctional epoxy (Tg 180° C.) on DuPont Type E-200 Series on-woven aramid reinforcement with a resin content of 49, non-MDA polymide on THERMOUNT® reinforcement, Arlon 85NT which is a combination of non-MDA pure polyimide resin coated on DuPont Type E-200 Series non-woven aramid reinforcement, flex tape such as printhead wiring, ceramic, silicon, and liquid crystal display ("LCD") glass.

The populated PWB 124 with the semiconductor components will then undergo a heat process to form a strong mechanical connection or bond and thus a thermal path between the thermally conductive particles of the thin film 120 and the solder pad 140. Generally, the heating process can include reflowing the solder balls 104. In reflowing the solder balls 104, the thermally conductive particles of the thin film 120 form a strong mechanical bond, a thermal connection or thermal path with the solder pad 140. In this way, not only can the reflowed solder pad 140 provide mechanical bonding between the semiconductor component and the PWB 124, but the reflowed solder pad 140 also provides a thermal path to cool the semiconductor component 100. Specifically, once the thermal path has been established, the heat generated in the semiconductor 100 during operation can be dissipated toward the PWB 124 via the thermal path.

Furthermore, since the thermal coefficients of expansion of the substrate 112 and of the PWB 124 are typically different, the substrate 112 and the PWB 124 will expand at different rates. In such a case, if the substrate 112 and the PWB 124 are held together only by the solder balls 104, the difference in the expansion rates between the substrate 112 and the PWB 124 can create mechanical stress at the solder balls 104. Having a thermal path, therefore, will cause the substrate 112 or the semiconductor 100 to expand less, which results in less mechanical stress at the solder balls 104.

The solder pad 140 can be physically positioned adjacent the thermally conductive particles of the thin film 120 by processes such as heating the solder pad 140 and the thin film 120, thermally coupling the solder pad 140 to the thin film 120, and inductively heating the solder pad 140 and the thin film 120. Although FIG. 3 shows the thermally conductive particles 152 in the thin film 120 distributed randomly, the thermally conductive particles 152 can also be arranged in a pattern depending on the applications on hand. Furthermore, some of the thermally conductive particles 152 are also shown not to be in direct contact with the solder pad 140. Rather, these thermally particles 152 are positioned adjacent to the solder pad 140 such that heat generated by the semiconductor component 100 can be dissipated to the solder pad 140 via the thermally conductive particles 152 due to their close proximity to the solder pad 140.

In some embodiments, the thin film 120, the solder pad 140, and the PWB 124 can have different melting points and can be temperature sensitive. For example, when the melting point of the thin film 120 is less than the melting point of the solder pad 140, the thin film 120 will melt before the solder pad 140 melts when heated. A premature melting of the thin film 120 can lead to several issues. In some embodiments, the premature melting will cause displacement of the thin film 120 from the substrate 112. In such a thin film displacement, the thin film 120 and the solder pad 140 are only partially bonded at some locations. In some other embodiments, the premature melting can cause the thin film 120 to flow to the solder balls 104. In such cases, the solder balls 104 can be inadvertently joined. In some cases, the inadvertent joining of solder balls 104 can short-circuit the semiconductor 100. As a result, the melting point of the thin film 120 is typically selected to be greater than the melting point of the solder pad 140. That is, a higher thin film melting point ensures the thin film 120 will not melt and thus the thin film 120 will not contact any solder balls 104. In some other embodiments, the compatibility of thermally conductive particles used in the thin film 120 with the solder is also taken into consideration when the materials of the thin film 120 and the PWB 124 are chosen. For example, any thermally conducting materials that form a mechanical bond between the thin film 120 and the solder pad 140 can be used.

Various features and advantages of the invention are set forth in the following claims.

The invention claimed is:

1. A method of packaging a semiconductor component with a printed wiring board, the semiconductor component having a first surface and a support extending from the first surface, and the support having a distal end spaced a first distance from the first surface, the method comprising:
applying a thin film onto the first surface of the semiconductor component, the thin film having a length and a width, wherein the thin film has a first thickness less than the first distance and has thermally conductive particles, and wherein the thin film is applied such that the first surface is the only surface of the semiconductor component that engages the thin film;
applying a solder pad onto the printed wiring board;
placing the semiconductor component with the thin film onto the printed wiring board; and
positioning the thin film adjacent to and engaging the solder pad, between the semiconductor component and the printed wiring board.

2. The method of claim 1, further comprising providing the semiconductor component such that the semiconductor component comprises at least one of a thin small-area outline package ("TSOP") and a ball grid array ("BGA") package.

3. The method of claim 1, further comprising providing the thin film such that the thin film comprises at least one of epoxy, gold, nickel, copper, tin, silver, glass, and adhesive.

4. The method of claim 1, wherein applying the thin film further comprises at least one of spraying the thin film on the semiconductor component, brushing the thin film on the semiconductor component, and attaching the thin film on the semiconductor component.

5. The method of claim 1, further comprising providing the solder pad such that the solder pad comprises at least one of tin, tin bismuth, and tin lead.

6. The method of claim 1, wherein positioning the solder pad and the thin film further comprises at least one of reflowing the solder pad, heating the solder pad and the thin film, thermally coupling the solder pad to the thin film, inductively heating the solder pad and the thin film, and creating a physical connection between the solder pad and some of the thermally conductive particles of the thin film.

7. The method of claim 1, further comprising:
providing a thermal path between the semiconductor component and the printed wiring board using the thin film and the solder path.

8. The method of claim 1, wherein the solder pad is applied such that the planar dimensions of the solder pad generally correspond to the planar dimensions of the thin film.

9. The method of claim 1, further comprising:
providing the printed wiring board with at least one of a plurality of thermally conductive particles, an epoxy, a glass, a polymide, a flex tape, a ceramic, and silicon.

10. The method of claim 1, further comprising selecting a melting point of the thin film and a second melting point of the solder pad such that the melting point of the thin film is greater than the second melting point of the solder pad.

11. The method of claim 1, wherein the supports have a first coefficient of thermal expansion, and wherein the solder pad has a second coefficient of thermal expansion, the method further comprising at least one of selecting the solder pad material such that the second coefficient of thermal expansion is substantially equal to the first coefficient of thermal expansion, and selecting the solder pad material such that the second coefficient of thermal expansion is less than the first coefficient of thermal expansion.

12. The method of claim 1, wherein the solder pad has a solder pad thickness, the method further comprising selecting the first thickness such that the first thickness is less than the solder pad thickness.

13. The method of claim 1, wherein the semiconductor component comprises a substrate, the method further comprising providing the substrate such that the substrate comprises at least one of ceramic, plastic, silicon, carbon composites, and metallic elements.

14. The method of claim 1, further comprising providing the at least one support such that the at least one support includes a solder ball.

15. The method of claim 1, further comprising providing the at least one support such that the at least one support includes a metal.

16. The method of claim 1, further comprising providing the at least one support such that the at least one support is thermally conductive.

17. The method of claim 1, further comprising providing the at least one support such that the at least one support is in thermal contact with the printed wiring board.

18. The method of claim 1, further comprising providing the thermally conductive particles such that the thermally conductive particles are arranged randomly.

19. The method of claim 1, wherein the solder pad has a solder pad thickness, the method further comprising providing the semiconductor component such that the first thickness plus the solder pad thickness is substantially equal to the first distance.

20. The method of claim 1, further comprising providing the solder pad such that the solder pad is configured to dissipate heat.

21. The method of claim 1, further comprising providing a solder mask in relation to the solder pad.

* * * * *